US010101860B2

(12) United States Patent
Marques et al.

(10) Patent No.: US 10,101,860 B2
(45) Date of Patent: Oct. 16, 2018

(54) BORDERLESS PROJECTED CAPACITIVE MULTITOUCH SENSOR

(71) Applicant: Displax S.A., Braga (PT)

(72) Inventors: Pedro Luis Fernandes Marques, Guimarães (PT); Miguel Angelo Magalhaes Fonseca, Braga (PT); José Miguel Fernandes Peixoto de Oliveira, Santo Tirso (PT); António Augusto Babo de Carvalho, Vila Meã (PT); Vitor Alfredo Oliveira de Sousa, Bairro (PT)

(73) Assignee: Displax S.A., Braga (PT)

( * ) Notice: Subject to any disclaimer, the term of this patent is extended or adjusted under 35 U.S.C. 154(b) by 168 days.

(21) Appl. No.: 15/215,121

(22) Filed: Jul. 20, 2016

(65) Prior Publication Data
US 2018/0024666 A1    Jan. 25, 2018

(51) Int. Cl.
*G06F 3/0488* (2013.01)
*G06F 3/044* (2006.01)
*H05K 1/11* (2006.01)
*G06F 3/041* (2006.01)
*G06F 3/047* (2006.01)

(52) U.S. Cl.
CPC .............. *G06F 3/044* (2013.01); *G06F 3/047* (2013.01); *G06F 3/0416* (2013.01); *G06F 3/0488* (2013.01); *H05K 1/11* (2013.01); *G06F 2203/04104* (2013.01); *G06F 2203/04112* (2013.01); *H05K 2201/1034* (2013.01); *H05K 2201/10287* (2013.01)

(58) Field of Classification Search
None
See application file for complete search history.

(56) References Cited

U.S. PATENT DOCUMENTS

| 5,361,078 A | 11/1994 | Caine |
| 7,262,746 B2 | 8/2007 | Lagarrigue et al. |
| 8,599,161 B2 | 12/2013 | Philipp |
| 9,128,560 B2 | 9/2015 | Ng et al. |

(Continued)

FOREIGN PATENT DOCUMENTS

| KR | 2011127101 A | 11/2011 |
| WO | WO2001027868 A | 4/2001 |

(Continued)

*Primary Examiner* — Gustavo Polo
(74) *Attorney, Agent, or Firm* — Fish & Richardson P.C.

(57) ABSTRACT

A projected capacitive touch sensor includes a sensor grid. The sensor grid includes one or more electrically conductive rows arranged in an at least partially transparent row layer. The sensor grid includes one or more electrically conductive columns arranged in an at least partially transparent column layer that is spaced apart from the row layer. The projected capacitive touch sensor includes a border region that surrounds at least a portion of the sensor grid. The border region includes a wired bus region that includes a row bus that extends from the one or more electrically conductive rows and a column bus that extends from the one or more electrically conductive columns. The projected capacitive touch sensor includes one or more connectors that are electrically connected to the row bus and the column bus. The wired bus region is configured to fold over an edge of a borderless display.

16 Claims, 9 Drawing Sheets

(56) References Cited

U.S. PATENT DOCUMENTS

| | | |
|---|---|---|
| 9,148,614 B2 | 9/2015 | Szolyga et al. |
| 2006/0077544 A1 | 4/2006 | Stark |
| 2008/0150906 A1 | 6/2008 | Grivna |
| 2011/0291966 A1 | 12/2011 | Takao et al. |
| 2011/0310037 A1 | 12/2011 | Moran et al. |
| 2013/0017321 A1 | 1/2013 | Kim et al. |
| 2013/0032414 A1 | 2/2013 | Yilmaz et al. |
| 2013/0044384 A1 | 2/2013 | Kim et al. |
| 2013/0113502 A1 | 5/2013 | Yilmaz et al. |
| 2013/0127772 A1 | 5/2013 | Guard et al. |
| 2013/0207911 A1 | 8/2013 | Barton et al. |
| 2014/0041924 A1 | 2/2014 | Cok |
| 2014/0055380 A1 | 2/2014 | Han et al. |
| 2014/0055403 A1 | 2/2014 | Cok |
| 2014/0210784 A1 | 7/2014 | Gourevitch et al. |
| 2014/0240289 A1* | 8/2014 | Myers ............... H04M 1/0268 345/174 |

FOREIGN PATENT DOCUMENTS

| | | |
|---|---|---|
| WO | WO2014001405 A | 1/2014 |
| WO | WO2014021168 A | 2/2014 |

* cited by examiner

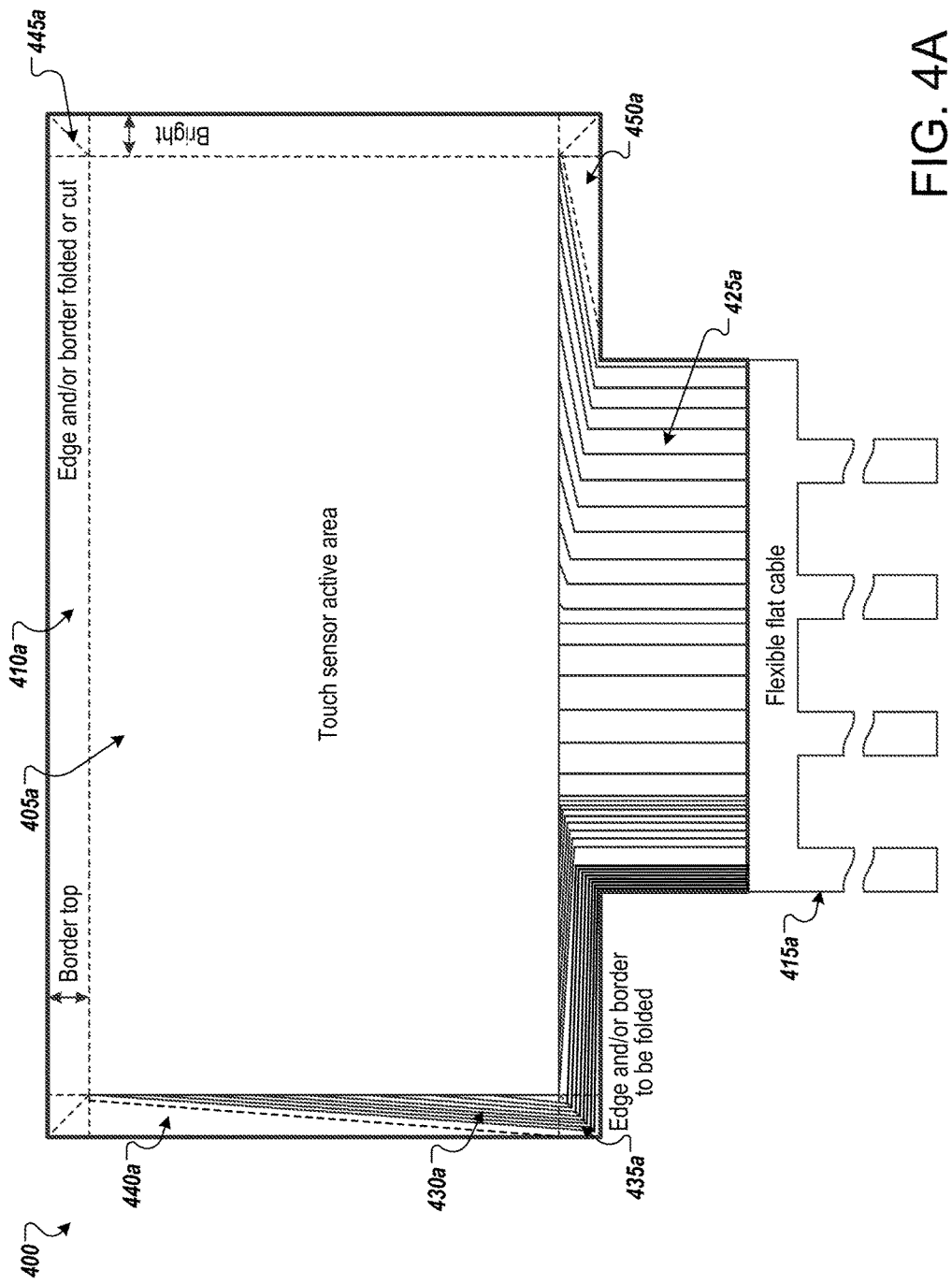

BORDERLESS PROJECTED CAPACITIVE MULTITOUCH SENSOR

FIELD

This application relates to projected capacitive touch sensors.

BACKGROUND

Touch-sensitive displays are widely employed for an expanding variety of applications ranging from mobile devices to fixed devices.

Projected Capacitive Technology (PCT) is becoming one of the most significant touch technologies for applications ranging from mobile devices to collaborative business and development. PCT refers to two main sensing methods called "self-capacitance" and "mutual capacitance" offering different performance characteristics and applications. Driven by the increasing number of users of touch-enabled mobile devices, consumer and professional expectations for touch applications have moved far beyond single-touch requirements into the realm of multi-touch and multi-user capabilities.

SUMMARY

When creating a touch sensitive video wall of LCD screens, the sensor grid was attached to the LCD screen and borders were traditionally needed between the LCDs to conceal edges of each sensor grid and any necessary control circuitry. To reduce the need for borders, each sensor grid can include a row connector that is dedicated to provide the signals from the row traces to the control circuit and a column connector that is dedicated to provide the signals from the column traces to the control circuit. The row connector and column connector connect to the row traces and column traces through a row bus and column bus, respectively. The row bus and column bus are at least partly located in a bus portion of a border region that surrounds the sensor grid. The border region also includes a non-bus portion where there are no row or column traces. Sections of the non-bus portion are removed to allow the border region to fold over the edge of the LCD screen. The removed sections can include a corner that is between the row bus and the column bus and that is tangential to the sensor grid. By folding the border region over the edges of the LCD screen, only the sensor grid is located on the LCD screen and the row bus and column bus are folded down the sides. The need for a border to conceal edges of the sensor grid is eliminated. By attaching sensor grids to other LCD screens in a similar manner, the touch sensitive LCDs may now be assembled into a borderless video wall.

According to an innovative aspect of the subject matter described in this application, a projected capacitive touch sensor includes a sensor grid that includes: one or more electrically conductive rows that are arranged in an at least partially transparent row layer; and one or more electrically conductive columns that are arranged in an at least partially transparent column layer that is spaced apart from the row layer; a border region that surrounds at least a portion of the sensor grid and that includes: a wired bus region that includes a row bus that extends from the one or more electrically conductive rows and a column bus that extends from the one or more electrically conductive columns; and one or more connectors that are electrically connected to the row bus and the column bus. The wired bus region is configured to fold over an edge of a display screen that does not include a border.

This and other implementations can each optionally include one or more of the following features. The one or more connectors include a row connector that is electrically connected to the row bus; and a column connector that is electrically connected to the column bus, and the border region further includes a non-bus region that does not include electrically conductive wires and that defines a removed portion of the non-bus region that is tangential to the sensor grid and that is located between the row bus and the column bus. The one or more connectors include a single connector that is electrically connected to the row bus and the column bus, and a portion of the row bus is located in a portion of the border region that is configured to fold over itself.

According to another innovative aspect of the subject matter described in this application a projected capacitive touch sensor includes a sensor grid that includes: one or more electrically conductive rows that are arranged in an at least partially transparent row layer; and one or more electrically conductive columns that are arranged in an at least partially transparent column layer that is spaced apart from the row layer; and a border region that surrounds at least a portion of the sensor grid and that includes: a wired bus region that includes a row bus that extends from the one or more electrically conductive rows and a column bus that extends from the one or more electrically conductive columns; and a non-bus region that does not include electrically conductive wires and that defines a removed portion of the non-bus region that is tangential to the sensor grid.

This and other implementations can each optionally include one or more of the following features. The removed portion is located between the row bus and the column bus. The row bus extends into a row connector and the column bus extends into a column connector that is different than the row connector. No gap exists between the sensor region and the removed portion of the non-bus region. The removed portion is a corner section of the non-bus region. The sensor grid is rectangular and the removed portion is square. The border region is configured to fold over an edge of a display screen. The display screen does not include a border that is not configured to display an image or video. The removed portion comprises all of the border region.

According to another innovative aspect of the subject matter described in this application a projected capacitive touch sensor includes: a sensor grid that includes: one or more electrically conductive rows that are arranged in an at least partially transparent row layer; and one or more electrically conductive columns that are arranged in an at least partially transparent column layer that is spaced apart from the row layer; a border region that surrounds at least a portion of the sensor grid and that includes: a wired bus region that includes a row bus that extends from the one or more electrically conductive rows and a column bus that extends from the one or more electrically conductive columns; and a connector that is electrically connected to the row bus and the column bus. A portion of the row bus is located in an area of the border region that is configured to fold over itself.

This and other implementations can each optionally include one or more of the following features. The area of the border region that is configured to fold over itself only includes the portion of the row bus and does not include the column bus. The sensor grid is rectangular and the area of the border region that is configured to fold over itself is square. The area of the border region that is configured to fold over itself is located at a corner of the projected capacitive touch sensor. The wired bus region is configured to fold over an edge of a display screen. The area of the border region that is configured to fold over itself at a corner of the display screen. The display screen does not include a border that is not configured to display an image or video. The border region includes a non-bus region that does not include electrically conductive wires. The non-bus region defines removed portions that are located at corners of the projected capacitive touch sensor.

According to another innovative aspect of the subject matter described in this application, a method of manufacturing a projected capacitive touch sensor includes the actions of forming a sensor grid that includes one or more electrically conductive rows in an at least partially transparent row layer; and one or more electrically conductive columns in an at least partially transparent column layer that is spaced apart from the row layer; forming a border region that surrounds at least a portion of the sensor grid and that includes a wired bus region that includes a row bus that extends from the one or more electrically conductive rows and a column bus that extends from the one or more electrically conductive columns; and a non-bus region that does not include electrically conductive wires; and removing a portion of the non-bus region that is tangential to the sensor grid.

This and other implementations can each optionally include one or more of the following features. The removed portion is located between the row bus and the column bus. The row bus extends into a row connector and the column bus extends into a column connector that is different than the row connector. No gap exists between the sensor grid and the removed portion of the non-bus region. The removed portion is a corner section of the non-bus region. The sensor grid is rectangular and the removed portion is square. The border region is configured to fold over an edge of a display screen. The display screen does not include a border that is not configured to display an image or video. The removed portion comprises all of the border region.

According to another innovative aspect of the subject matter described in this application a method of manufacturing a borderless touch display includes the actions of receiving data indicating measurements of a display; forming a sensor grid that matches the measurements of the display and that includes: one or more electrically conductive rows in an at least partially transparent row layer; and one or more electrically conductive columns in an at least partially transparent column layer that is spaced apart from the row layer; forming a border region that surrounds at least a portion of the sensor grid and that includes: a wired bus region that includes a row bus that extends from the one or more electrically conductive rows and a column bus that extends from the one or more electrically conductive columns; and a non-bus region that does not include electrically conductive wires; removing a portion of the non-bus region that is tangential to the sensor grid; adhering the sensor grid to a transparent panel that matches the measurement of the display; adhering the transparent panel and the sensor grid to the display; and folding remaining portions of the border region over edges of the display.

This and other implementations can each optionally include one or more of the following features. The actions further include joining the display to another display with a sensor grid and removed portions of non-bus regions. The actions further include attaching a support to an outer edge of the joined displays. The actions further include attaching a ribbon to an outer edge of the joined displays, the ribbon being configured to block electromagnetic interference.

Other implementations of the aspects above include corresponding systems, apparatus, and computer programs recorded on computer storage devices, each configured to perform the operations of the methods.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 3, 4, and 4A illustrate example projected capacitive touch sensors.

DETAILED DESCRIPTION

Figure 1:
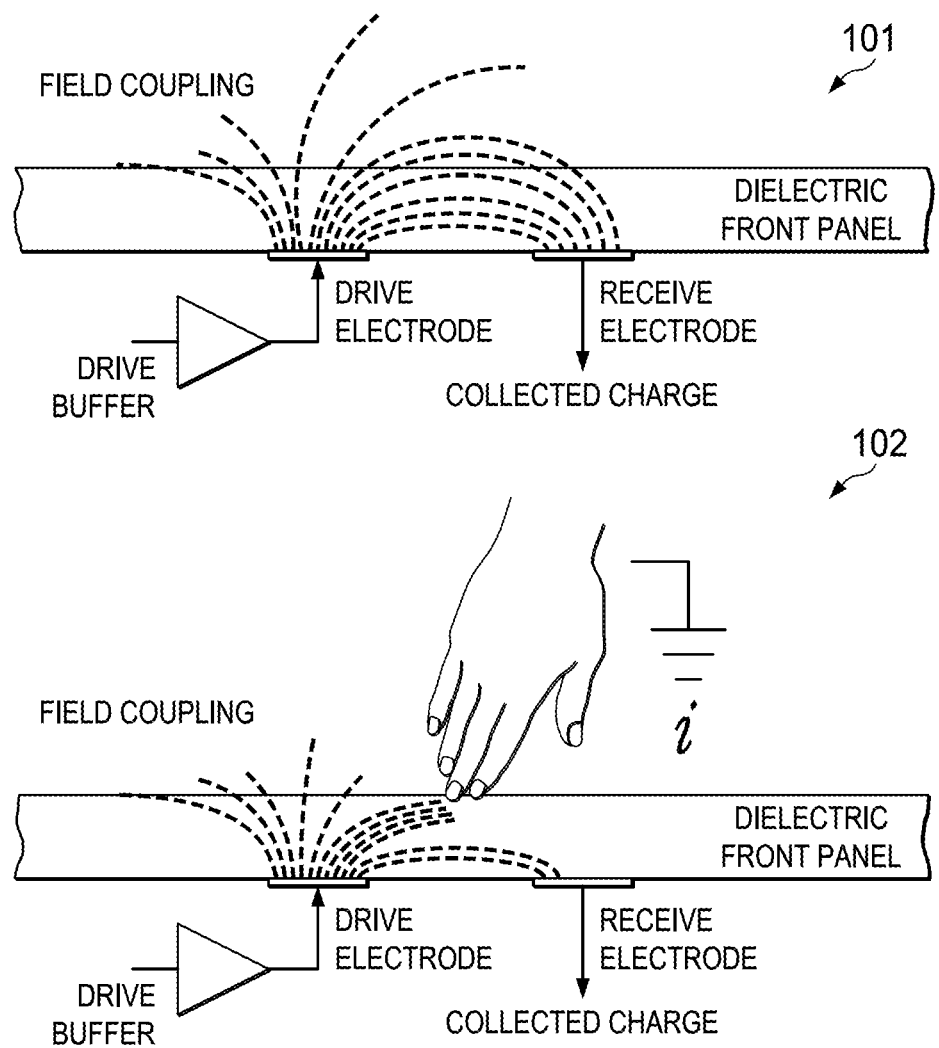
FIG. 1 illustrates the working principles of projected capacitive touch sensing technology.

FIG. 1 illustrates the working principles of projected capacitive touch sensing technology. 101 is the sensor without an external conductive object in close proximity, while 102 is the sensor with an external conductive object in close proximity. PCT may be based on a grid, or matrix, made of electrically conductive material, having this material as columns and rows. The columns and rows may serve as electrodes. The detection method may be based on interference caused by an external conductive touch object, e.g., finger or conductive pointer that are grounded, on the electrostatic field generated between the rows and columns, more precisely at the interceptions between rows and columns—these interceptions may be designated as nodes. These nodes, electrically speaking, may behave like capacitors, with very low charge capacity, in the pico Farad (pF) range, and with charge variation in the femto Farad (fF) range when externally disturbed, e.g., when touching with the external object. In other words, PCT detects touch by measuring the capacitance at each addressable electrode. When a finger or a conductive object approaches an electrode, it disturbs the electromagnetic field and alters the capacitance. This change in capacitance can be measured by the electronics and then converted into X, Y locations that the system can use to detect touch.

Figure 2:
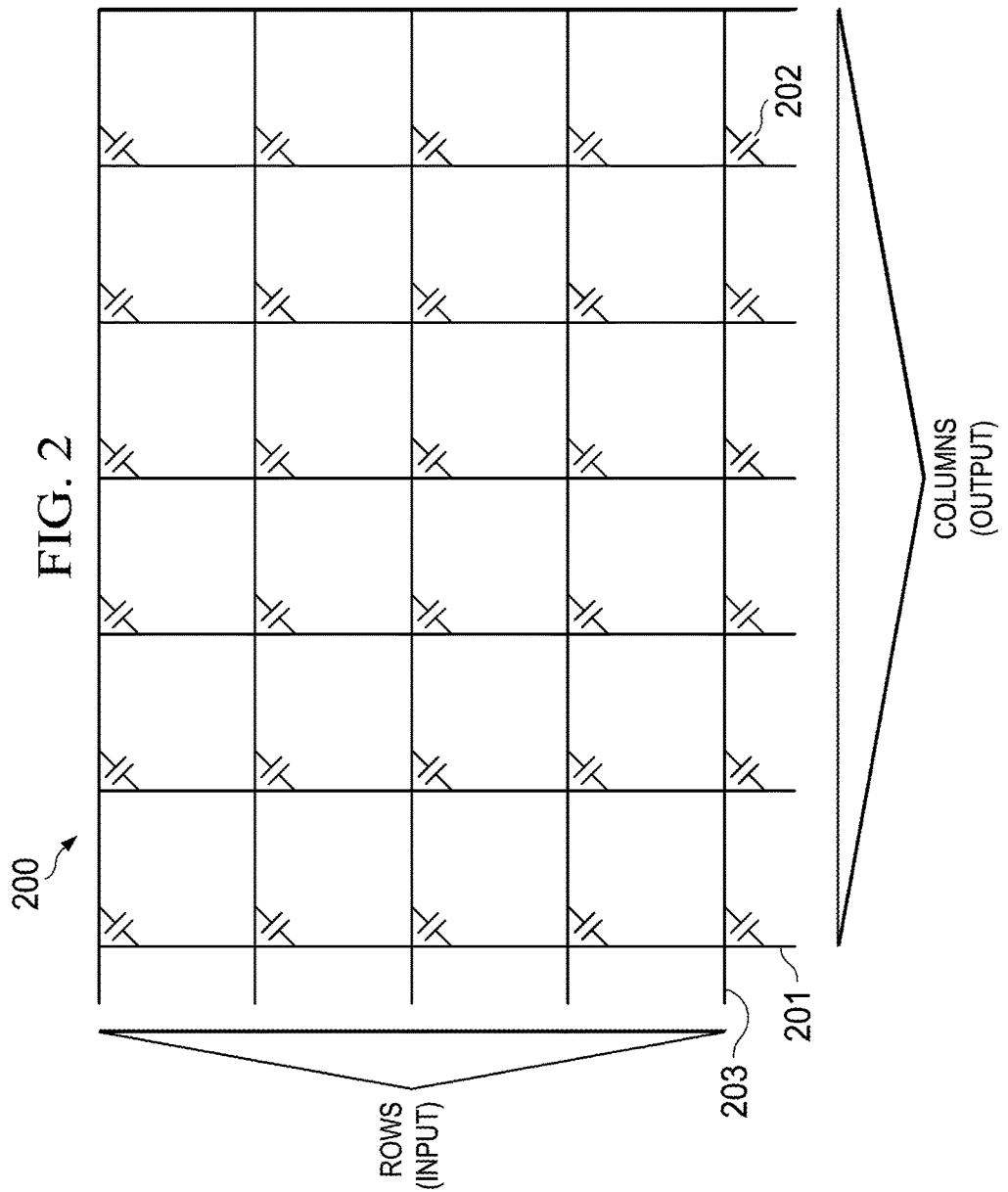
FIG. 2 illustrates components of an example projected capacitive touch sensor.

FIG. 2 illustrates components of a projected capacitive touch sensor 200. In an aspect, an alternate current signal is injected, e.g., AC signal, in one of the rows 203 and, on each column 201, one may find the same signal with a fraction of the injected signal amplitude. The signal amplitude obtained on each column is the result of the original AC signal passing through the capacitor 202 created at the node, or interception, between the selected row and the column. This sensor output amplitude may vary between columns due to physical and electrical differences that may exist for among columns, e.g., equivalent capacitors to each node have different charge capacities, thereof, different output signal values or amplitudes. For example, the electrical signal may be injected in the rows and collected at the columns, but the process works in reverse. In some implementations, one can inject the signals in the columns and collect it at the rows.

The signal amplitude at the columns output may be changed, e.g., it will be smaller or larger when a conductive object, exterior to the grid, disturbs the electrostatic field created at the node between the row and column. This conductive object is, in this circuit context, the touching or "getting near" finger in the grid which will divert part of that electrostatic field to earth/ground. One may use this difference of signal amplitude, e.g., amplitude without touch minus amplitude with touch, to identify the presence of an exterior conductive object, thus, the existence of a touch event.

There are two main types of sensing methods, self-capacitance and mutual capacitance, where each has its own advantages and disadvantages. While for self-capacitance, each electrode is scanned individually, in mutual capacitance each electrode node or intersection is scanned for the determination of a touch event. Mutual capacitance may allow an unlimited number of unambiguous touches, may produce higher resolution than self-capacitance and may be less sensitive to electromagnetic interference (EMI) than self-capacitance. In self-capacitance, due to the scanning method, so-called ghost points may occur so that it may not be possible to unambiguously detect more than one touch event when using rows and columns. However, both types of sensing methods are based on a charge transfer between human-body or touch object and either single electrode or pair of electrodes.

Mutual capacitance is the intentional or unintentional capacitance between two "charge holding objects." Projected capacitance touch-screens intentionally create mutual capacitance between elements of columns and rows in the vicinity where each intersect the other. This allows the system electronics to measure each node, or intersection, individually to detect multiple touches on the screen during one screen scan. When a touch object touches near an intersection or node, some of the mutual capacitance between the row and column is coupled to the touch object, which reduce the capacitance at the intersection as measured by the system electronics. This reduced capacitance crosses the "touch threshold" set by the electronics indicating a touch has occurred.

Touch sensors based on PCT may be scanned as mentioned above. The term "scanned" as used herein may mean that individual electrodes, e.g. rows or columns, intersections or nodes are measured, e.g. one-by-one in a cycle. Mutual-capacitance touch screens may use a scanning method that measures the capacitance at each row and column intersection. In this scanning method, the controller drives a single column and then scans every row, or vice versa, that intersects with that column, measuring the capacitance value at each X-Y intersection. This process may be repeated for every column and then the entire cycle starts over. The scanning rate may be more than 20 Hz, for example, up to 200 Hz, 400 Hz, or 500 Hz. The sensor grid may have any number of columns and rows, for example, 64-700 columns and 36-400 rows, for example 168 columns and 96 rows.

The layers of the sensor grid may be arranged in a face-to-face stacking process. The sensor grid may comprise one or more layers, which may be at least one of: conductive row layer, conductive column layer, optically clear adhesives, substrates, covers, or additional dielectric bridges. For example, the sensor grid, may include a conductive row layer, a conductive column layer and an optically clear adhesive (OCA). The rows and columns may be electrodes that are conductively connected via cables or wires with the controller. The sensor grid may be placed on a display layer. The materials used for the bridges and the OCA may be optically clear or transparent, and/or flexible materials, for example, materials with maximum haze below about 1%, and/or, with minimum light transmission, for example, above about 99%, for example an acrylic adhesive. The properties for bridge material may be: transparent, non-conductive, flexible, and/or dielectric constant substantially equivalent to glass, acrylic, or polyester.

The sensor grid layers stacking may be dependable on how the conductive rows and columns are created. There are three layer stacking configurations normally used: separated rows and columns layers facing each other, e.g., face to face stacking, rows and columns in the same layer, e.g., bridged stacking, rows and columns on opposite side of the same layer, e.g., dual side stacking. The substrate layers, e.g., where the rows and columns will be created, and the cover layers may be polyethylene terephthalate (PET) films or other types of at least partially transparent, e.g., within or across the visible spectrum, and flexible materials. For example, polymethylpentene (PMP), polypropylene (PP), polycarbonate (PC), polyvinyl chloride (PVC), poly(methyl methacrylate) (PPMA), polystyrene (PS), styrene acrylonitrile (SAN), among others. Also, a flexible glass material can be used. In the next sub-sections, the aforementioned configurations are illustrated.

In this face-to-face stacking configuration, the rows and the columns are created in separated layers, with the printed side facing each other. To isolate them electrically and, at the same time, act as dielectric, and to bond them when laminated, one may use a non-conductive layer of optically clear adhesive (OCA). The flexible cables may be bonded or soldered to the corresponding traces or buses before or after the layer lamination, depending on the production process used.

The layers of the sensor grid may be arranged with a bridged stacking process. The sensor grid may comprise one or more layers, which may be at least one of: a layer shared by conductive rows and conductive columns, optically clear adhesives, substrates, covers, or additional dielectric bridges. For example, the sensor grid may include a layer shared by conductive rows and conductive columns, e.g., rows and columns in the same layer, and an optically clear adhesive (OCA) positioned between each row and column at the respective row-column-nodes. The rows 405b and columns 404b may be electrodes that are conductively connected via cables or wires 406a with the controller 304. FIG. 4B illustrates the sensor grid before and after lamination, and relative to the display layer 302.

In this bridged stacking configuration, the rows and the columns may be created in the same layer, having a transparent non-conductive material, e.g., OCA, between them where their projections spatially overlap. These non-conductive material blocks are called dielectric bridges. They may isolate electrically the rows and columns and act as dielectric. Also, it is used a cover layer to close and protect the rows and columns traces and an OCA layer to bond them when laminated. The flexible cables 406a may be bonded or soldered to the corresponding buses before or after the layer lamination, depending on the production process used.

The sensor grid 301 may be arranged with a dual-side stacking process. The sensor grid may comprise one or more layers, which may be at least one of: a layer shared by conductive rows and conductive columns, optically clear adhesives, substrates, covers, or additional dielectric bridges. For example, the sensor grid may include a layer shared by conductive rows and conductive columns, e.g., rows and columns on opposite side of the same layer, and one or more optically clear adhesive (OCA) layers positioned between layer and one or more cover layers. The rows and columns may be electrodes that are conductively connected via cables or wires with the controller.

In this dual-side stacking configuration, the rows and the columns may be created in the same layer, but on opposite sides, e.g., having the layer substrate, the rows are created on the top side, e.g. top surface, and the columns on the bottom side, e.g., bottom surface, or vice-versa, of the shared layer. The substrate layer may act as isolator and a dielectric. One may use a cover layer on each side of the layer to close and protect the rows and columns traces and the one or more OCA layers, e.g., also on each side to bond them when laminated. The flexible cables connect the rows and columns to the controller, e.g. cables may be bonded or soldered to the corresponding traces or buses before or after the layer lamination, depending on the production process used.

Figure 3:
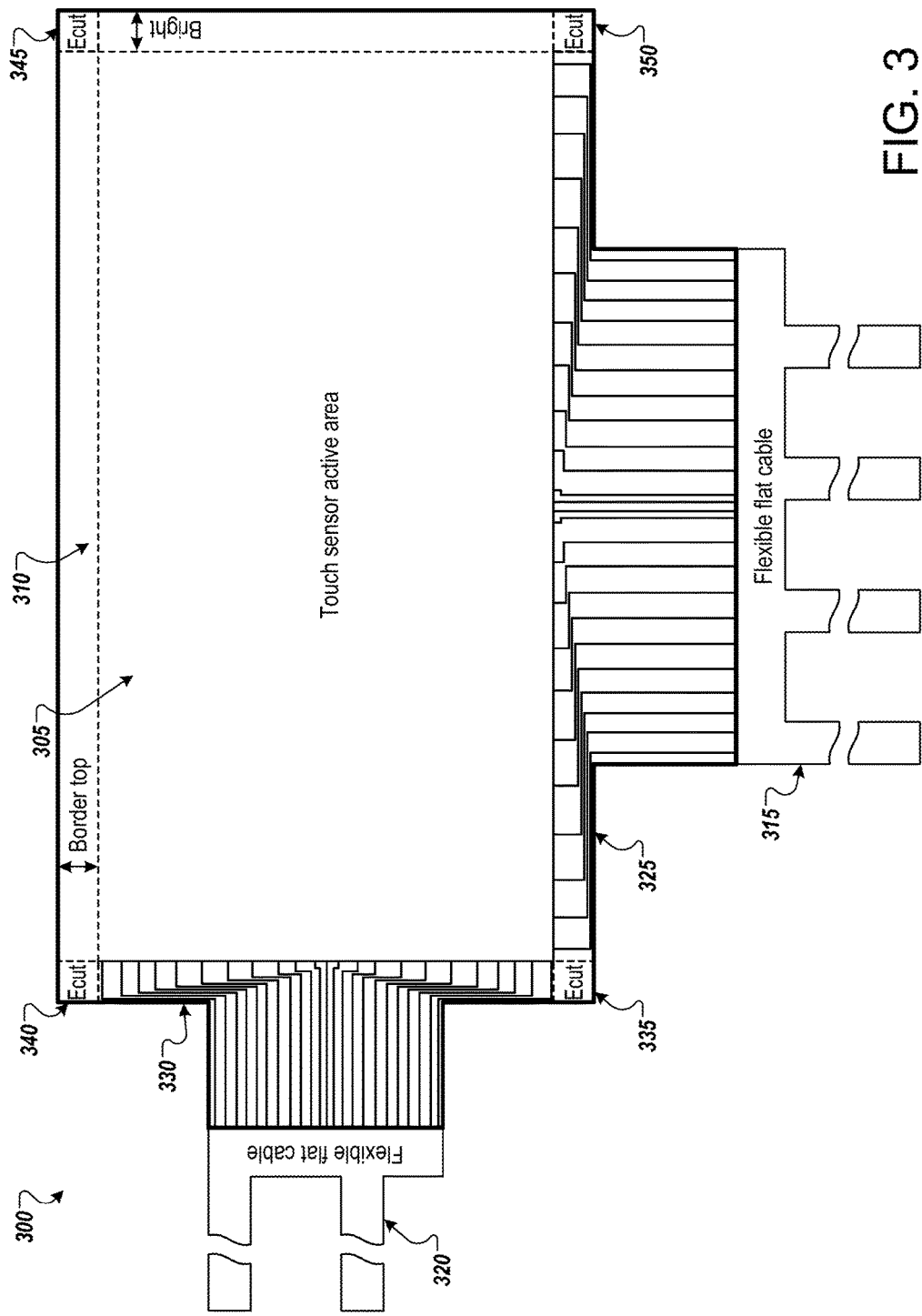

FIG. 3 illustrates an example projected capacitive touch sensor 300. Briefly, and as described in more detail below, the projected capacitive touch sensor 300 includes a sensor grid 305 that overlays a borderless display screen, e.g., an LCD screen or similar flat panel screen. The sensor grid 305 is surrounded by a border region 310 that is for folding over the edges of the LCD screen. By folding over the border region, none of the projected capacitive touch sensor 300 remains on the borderless display screen, thus creating a borderless touch panel display that may be joined with other borderless touch panel displays to create a touch panel video wall without borders between the screens.

The projected capacitive touch sensor 300 includes an active sensor grid 305 that uses capacitive sensing to detect touches. The sensor grid 305 includes row traces and column traces throughout the sensor grid 305. One end of the column traces terminates at an edge of the sensor grid 305, and the other end of the column traces terminates at a column connector 315. The column connector 315 may be any type of connector that can be connected to a circuit that is configured to interpret the signals produced by the sensor grid 305. The column connector 315 is flexible and flat so that it can be hidden behind a display screen. In some implementations, the column connector 315 is a double tail connector. Similar to the column traces, one end of the row traces terminates at an edge of the sensor grid 305, and the other end of the row traces terminates at a row connector 320. The row connector 320 may be any type of connector that can be connected to a circuit that is configured to interpret the signals produced by the sensor grid 305.

The column traces between the column connector 315 and the sensor grid 305 are located in the column bus 325. The column bus 325 is a flexible portion of the projected capacitive touch sensor 300 where each of the column traces travel through to the column connector 315. In some implementations, the column bus 325 only contains the column traces and none of the row traces. As illustrated in FIG. 3, the column bus 325 covers the T-shaped area of the projected capacitive touch sensor 300 between the column traces on either end of the sensor grid 305 and outside of the sensor grid 305. A portion of the column bus 325 is located in the border region 310. The portion of the column bus 325 located in the border region 310 may vary depending on the layout of the column traces. For example, the column traces in the column bus 325 may only include traces laid in straight lines that change direction at right angles.

Similarly, the row traces between the row connector 320 and the sensor grid 305 are located in the row bus 330. The row bus 330 is a flexible portion of the projected capacitive touch sensor 300 where each of the row traces travel through to the row connector 320. In some implementations, the row bus 330 only contains the row traces and none of the column traces. As illustrated in FIG. 3, the row bus 330 covers the T-shaped area of the projected capacitive touch sensor 300 between the row traces on either end of the sensor grid 305 and outside of the sensor grid. A portion of the row bus 330 is located in the border region 310. The portion of the row bus 330 located in the border region 310 may vary depending on the layout of the row traces. For example, the row traces in the row bus 330 may only include traces laid in straight lines that change direction at right angles.

Around the edges of the sensor grid 305 is the border region 310. The border region 310, including the portions of the border region that include the row bus 330 and the column bus 325, is made of flexible material so that it can be folded over the edges of a display. The width of the border region 310 can be any width. For example, the width of the border region 310 may be constant and may be based on the space required for the row and column traces to travel to their respective connectors. The width of the border region 310 may also vary around the sensor grid 305. For example, the border region 310 may be longer on the side opposite the row connector 320 than on the side opposite the column connector 315.

The border region outside of the row bus 330 and the column bus 325 is the non-bus region. The non-bus region does not include any of the column traces or any of the row traces. The non-bus region is not necessarily a continuous region. For example, the non-bus region may include an L-shaped portion that includes the areas opposite the column connector 315 and the row connector 320. The non-bus region may also include a square portion between the row bus 330 and column bus 325.

In order for the border region 310 to fold over the edges of a display, portions of the non-bus region may be removed from the border region 310 so that the sensor grid 305 is able to lie flat against the display and so that the border region 310 is able to firmly contact the edges of the display. The four border portions 335, 340, 345, and 350 may be each removed from the border region 310. Each removed border portion 335, 340, 345, and 350 may be square shaped and located at a corner of the border region 310. In some implementations, the removed border portion 335, 340, 345, and 350 may not be square shaped, but instead may be any shape that does not cut into the sensor grid 305 or into the row bus 330 and column bus 320. At least one point on each of the removed border portions 335, 340, 345, and 350 should contact the edge of the sensor grid 305. In some implementations, the projected capacitive touch sensor 300 may be formed without the removed border portions 335, 340, 345, and 350. In this instance, it is not necessary to remove the border portions 335, 340, 345, and 350 because the projected capacitive touch sensor 300 did not originally include them.

Figure 4:
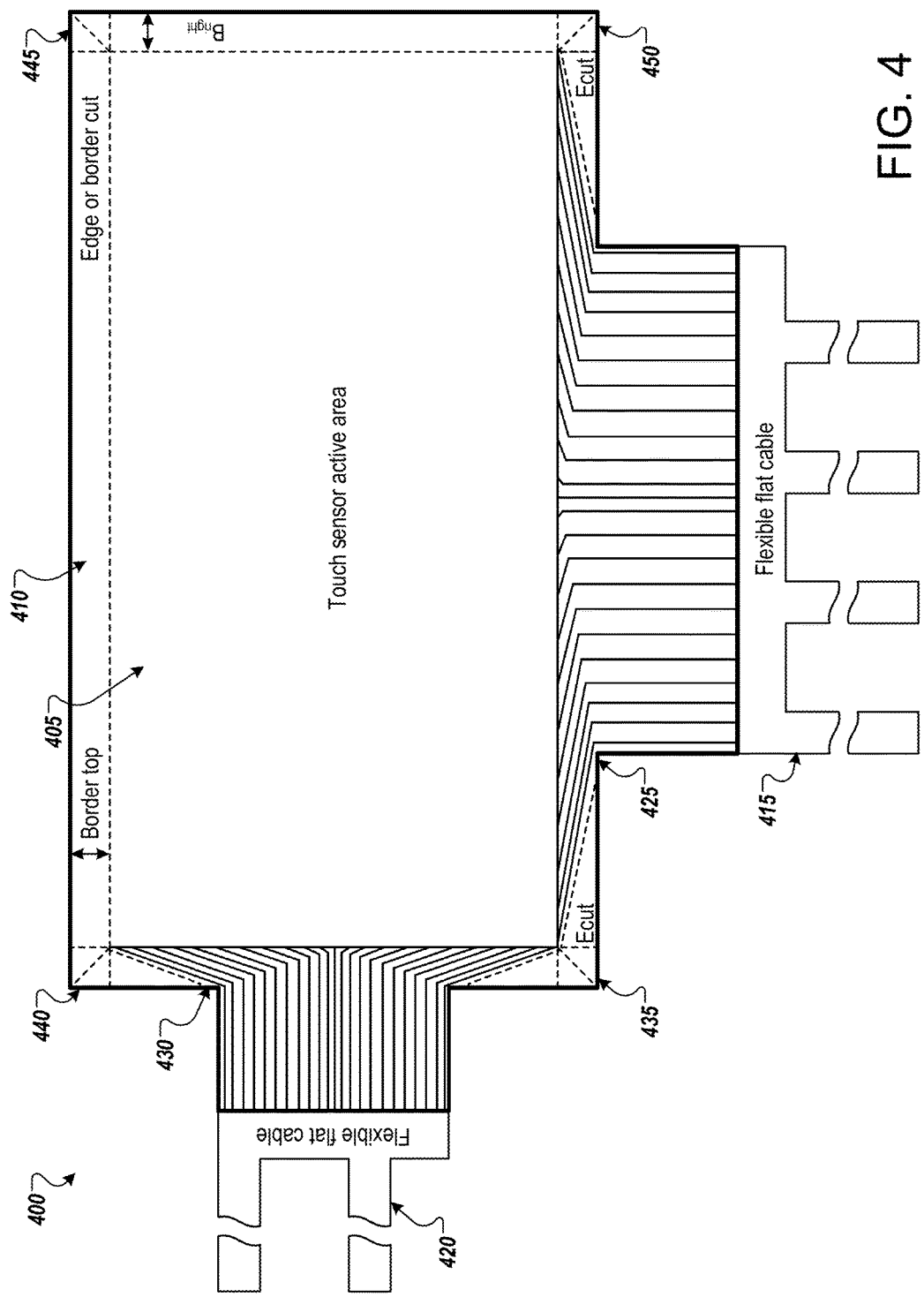

FIG. 4 illustrates an example projected capacitive touch sensor 400. Briefly, and as described in more detail below, the projected capacitive touch sensor 400 is similar to the projected capacitive touch sensor 300, but includes a different border region 410 and a different row bus 430 and column bus 425. Like the projected capacitive touch sensor 300, the projected capacitive touch sensor 400 is configured to combine with a LCD screen so that the sensor grid 405 covers to the edges of the LCD screen and the border region 410, row bus 430, and column bus 425 are folded over the edges of the LCD screen to create a borderless touch panel display. The borderless touch panel display may then be joined with other borderless touch panel displays to create a touch panel video wall without borders between the screens.

The projected capacitive touch sensor 400 includes a sensor grid 405 that is similar to sensor grid 305 and is capable of detecting touches. The projected capacitive touch sensor 400 also includes row connector 420 that is similar to the row connector 320 and a column connector 415 that is similar to the column connector 315. Both the row connector and column connector 415 connect to a controller circuit that processes the signals generated by the projected capacitive touch sensor 400.

The projected capacitive touch sensor 400 illustrates another example arrangement of the row bus 430 and column bus 425. The row traces in the row bus 430 are arranged in straight lines, but instead of only including right angles, the row bus 430 includes row traces that meet at any angle, for example, one hundred twenty degrees. In some implementations, the row traces in the row bus 430 are curved. The column traces in the column bus 425 are similarly arranged in straight lines that meet at any angle, for example, one hundred twenty degrees. In some implementations, the column traces in the column bus 425 are curved.

The non-bus portion of the border region 410 in the projected capacitive touch sensor 400 is split into two sections. One section of non-bus portion of the border region 410 includes corners 440, 445, and 450. The other section of the non-bus portion of the border region 410 includes corner 435. Different portions of the non-bus portion may be removed in addition to the corners 435, 440, 445, and 450. For example, all of the non-bus portion, which is up to the edge of the sensor grid 405 and up to the edges of the column bus 425 and row bus 430 may be removed. In this case, the sensor grid 405 is placed on top of the display and the column bus 425 and row bus 430 are folded over the edges of the display. There are no non-bus portions remaining to fold over.

As noted above, the non-bus portion may include removed portions that are not consistent in the border region 410. For example, the non-bus portion that includes corner 435 may be completely removed up to the edges of corner of the sensor grid 405 and the column bus 425 and row bus 430. In the non-bus portion that includes corners 440, 445, and 450, only the corners 440, 445, and 450 may be removed. As another example, the L-shaped region from corner 440 to corner 450 and including corner 445 may be removed without removing the triangular regions between corner 450 and the column bus 425 and between the corner 440 and the row bus 430. The non-bus portion that includes corner 435 may be completely removed up to the edges of corner of the sensor grid 405 and the column bus 425 and row bus 430.

FIG. 4A illustrates an example projected capacitive touch sensor 400a. Briefly, and as described in more detail below, the projected capacitive touch sensor 400a includes a sensor grid 405a that overlays a borderless display screen, e.g., an LCD screen or similar flat panel screen. The sensor grid 405a is surrounded by a border region 410a that is for folding over the edges of the LCD screen. By folding over the border region, none of the projected capacitive touch sensor 400a remains on the borderless display screen, thus creating a borderless touch panel display that may be joined with other borderless touch panel displays to create a touch panel video wall without borders between the screens.

The projected capacitive touch sensor 400a includes an active sensor grid 405a that uses capacitive sensing to detect touches. The sensor grid 405a includes row traces and column traces throughout the sensor grid 405a. One end of the column traces terminates at an edge of the sensor grid 405a, and the other end of the column traces terminates at a connector 415a. The connector 415a may be any type of connector that can be connected to a circuit that is configured to interpret the signals produced by the sensor grid 415a. The connector 415a is flexible and flat so that it can be hidden behind a display screen. In some implementations, the connector 415a is a double tail connector. Similar to the column traces, one end of the row traces terminates at an edge of the sensor grid 405a, and the other end of the row traces terminates at the connector 415a.

The column traces between the connector 415a and the sensor grid 405a are located in the column bus 425a. The column bus 425a is a flexible portion of the projected capacitive touch sensor 400a where each of the column traces travel through to the connector 415a. In some implementations, the column bus 425a only contains the column traces and none of the row traces. As illustrated in FIG. 4A, the column bus 425a covers a modified T-shaped area of the projected capacitive touch sensor 400a between the column traces on either end of the sensor grid 405a and outside of the sensor grid 405a. A portion of the column bus 425a is located in the border region 410a. The portion of the column bus 425a located in the border region 410a may vary depending on the layout of the column traces. For example, the column traces in the column bus 425a may only include traces laid in straight lines that change direction at right angles. As another example, the column traces in the column bus 425a may include traces that meet at angles other than right angles.

Similarly, the row traces between the connector 415a and the sensor grid 405a are located in the row bus 430a. The row bus 430a is a flexible portion of the projected capacitive touch sensor 400a where each of the row traces travel through to the row connector 420a. In some implementations, the row bus 430a only contains the row traces and none of the column traces. As illustrated in FIG. 4A, the row bus 430a covers the zig zag area of the projected capacitive touch sensor 400a between the row traces on either end of the sensor grid 305 and outside of the sensor grid. A portion of the row bus 330 is located in the border region 410a. The portion of the row bus 430a located in the border region 410a may vary depending on the layout of the row traces. For example, the row traces in the row bus 430a may only include traces laid in straight lines that change direction at acute or obtuse angles. As another example, the row traces in the row bus 430a may only include traces laid in straight lines that change direction at right angles. As yet another example, the row traces may include any combination of right angles, acute angles, or obtuse angles.

In some implementations, the spacing between the row traces in the row bus 430a is constant, as is illustrated in FIG. 4A. In some implementations, the spacing between the row traces in the row bus 430a varies. In some implementations, the spacing between the column traces in the column bus 425a varies, as is illustrated in FIG. 4A. In some implementations, the spacing between the column traces in the column bus 425a is constant.

Around the edges of the sensor grid 405a is the border region 410a. The border region 410a, including the portions of the border region that include the row bus 430a and the column bus 425a, is made of flexible material so that it can be folded over the edges of a display and over the border region 410a itself. The width of the border region 410a can be any width. For example, the width of the border region 410a may be constant and may be based on the space required for the row and column traces to travel to the connector 415a. The width of the border region 410a may also vary around the sensor grid 405a. For example, the border region 410a may be longer on the side opposite the connector 415a than on the sides adjacent to the side with the connector 415a.

The border region outside of the row bus 430a and the column bus 425a is the non-bus region. The non-bus region does not include any of the column traces or any of the row traces. In contrast to the examples of FIGS. 3 and 4, the non-bus region may be a continuous region. For example, the non-bus region may include an L-shaped portion 445a that includes the areas opposite the row bus 430a and the column bus 425a as well as triangular areas 440a and 450a.

In order for the border region 410a to fold over the edges of a display, portions of the non-bus region may be removed from the border region 310 so that the sensor grid 305 is able to lie flat against the display and so that the border region 310 is able to firmly contact the edges of the display. For example, L-shaped portion 445a and triangular areas 440a and 450a may be removed. In some implementations, only the three corners that may be included in the L-shaped portion 445a and triangular areas 440a and 450a may be removed. In contrast to the examples shown in FIGS. 3 and 4, corner 435a includes row bus 430a and because of that cannot be removed. Instead, corner 435a is folded over itself. For example, the border region 410a that includes row bus 430a may be folded over an edge of the display. The border region 410a that attaches to the connector 415a may then be folded down. A triangular region that is about half the size of corner 435a is then folded over itself and is attached to either edge. The overlapping triangular region includes three layers of the row bus 430a. In some implementations, the shape of the display may not be rectangular. In this instance, the shape of the overlapping region of the row bus 430a may be something other than triangular. In some implementations, the other corners of the border region 410a are folder and overlapped in a similar manner to corner 435a instead of removed.

In some implementations, a projected capacitive touch sensor may have more than two connectors. For example, a projected capacitive touch sensor may have three connectors. Two of the connectors may be connected to the row traces and two connectors may be connected to the column traces. The row traces and column traces may alternate when connecting to the connectors. For example, the first, third, fifth, etc. row traces may connect to a first connector on one end, and the second, fourth, sixth, etc. row traces may connect to a second connector on an opposite end. Similarly for the column traces, the odd traces may connect to a column connector on one end, and the even traces may connect to a different column connector on the other end. In some implementations, the row traces are connected to two connectors and the column traces are connected to one connector. In some implementations, the column traces are connected to two connectors and the row traces are connected to one connector. In some implementations, more than one connector may be located on one side of the projected capacitive touch sensor. For example, the row connector may be on one end of the projected capacitive touch sensor and the column connector may be located on the same end. In some implementations, the row connector or the column connector may be split into more than one connector that are located on a same edge of the projected capacitive touch sensor.

In some implementations, the connector 415a may be located on a row side of the projected capacitive touch sensor 400a. For example, the row bus 430a may be configured in a modified T-shape similar to the column bus 425a. Then the column bus 425a may be located in the corner 435a to reach the connector 415a on the row side.

Figure 5:
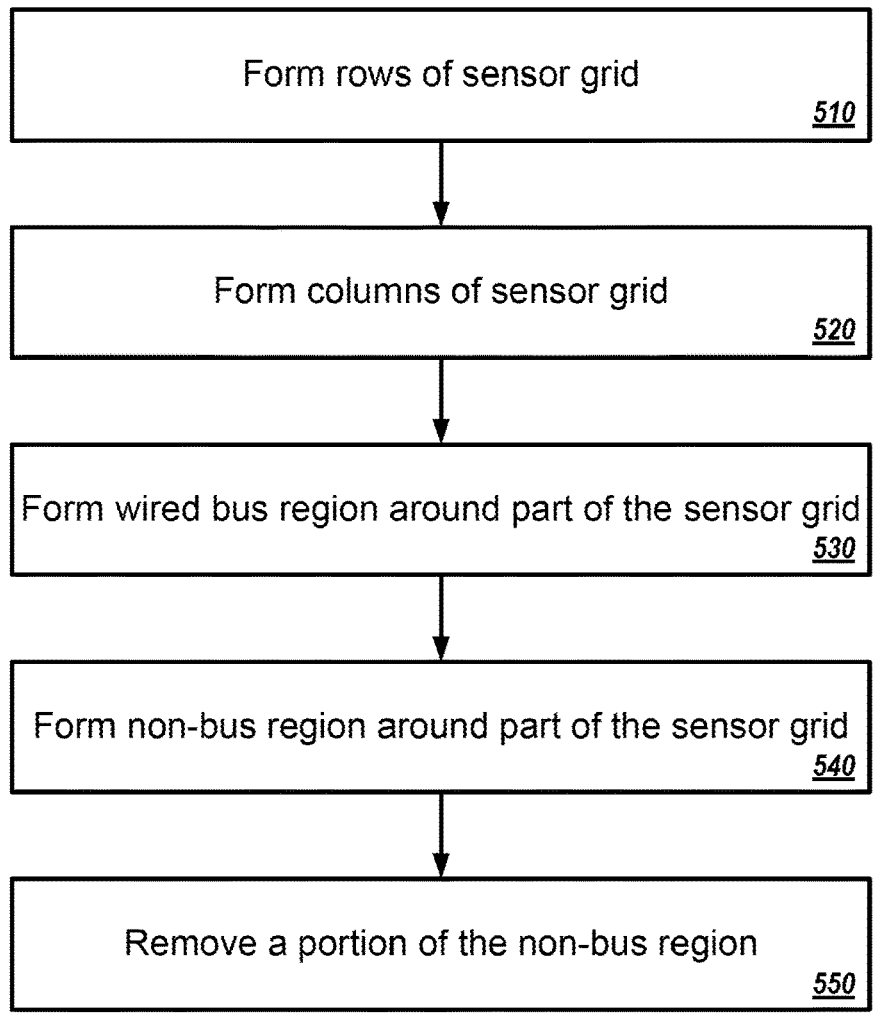
FIG. 5 illustrates an example process for manufacturing a projected capacitive touch sensor.

FIG. 5 illustrates an example process 500 for manufacturing a projected capacitive touch sensor. In general, the process 500 generates a projected capacitive touch sensor similar to the sensors illustrated in FIGS. 3 and 4. At least some of the process 500 may be performed by a computer system comprising one or more computers.

A sensor grid is formed that includes one or more electrically conductive rows in an at least partially transparent row layer (510). One or more electrically conductive columns in an at least partially transparent column layer that is spaced apart from the row layer is added to the sensor grid (520). The sensor grid may be formed using any of the processes described above, such as, face to face stacking, bridged stacking, or dual side stacking.

A border region is formed that surrounds at least a portion of the sensor grid and that includes a wired bus region that includes a row bus that extends from the one or more electrically conductive rows and a column bus that extends from the one or more electrically conductive columns (530). A non-bus region that does not include electrically conductive wires is added to the border region (540). In some implementations, the border region is formed along with the sensor grid. In some implementations, the sensor grid is rectangular. In some implementations, the row bus extends into a row connector and the column bus extends into a column connector that is different than the row connector. The row connector and the column connector are configured to connect to a circuit that processes the signals generated by the sensor grid. In some implementations, the border region is configured to fold over an edge of a display screen. In this case, the display screen is a borderless LCD screen where the sensor grid is the same size as the screen. The sensor grid is adhered to the LCD screen and the border region folds over the edges of the screen.

A portion of the non-bus region that is tangential to the sensor grid is removed (550). In some implementations, the removed portion is located between the row bus and the column bus. For example, a square is removed at a corner between the row bus and the column bus. In some implementations, there is no gap between the sensor grid and the removed portion of the non-bus region. For example, if the removed portion is a square, then a corner of the sensor grid may correspond to a corner of the removed square. In some implementations, all of the non-bus region is removed. In some implementations, none of the non-bus region is removed.

Figure 6:
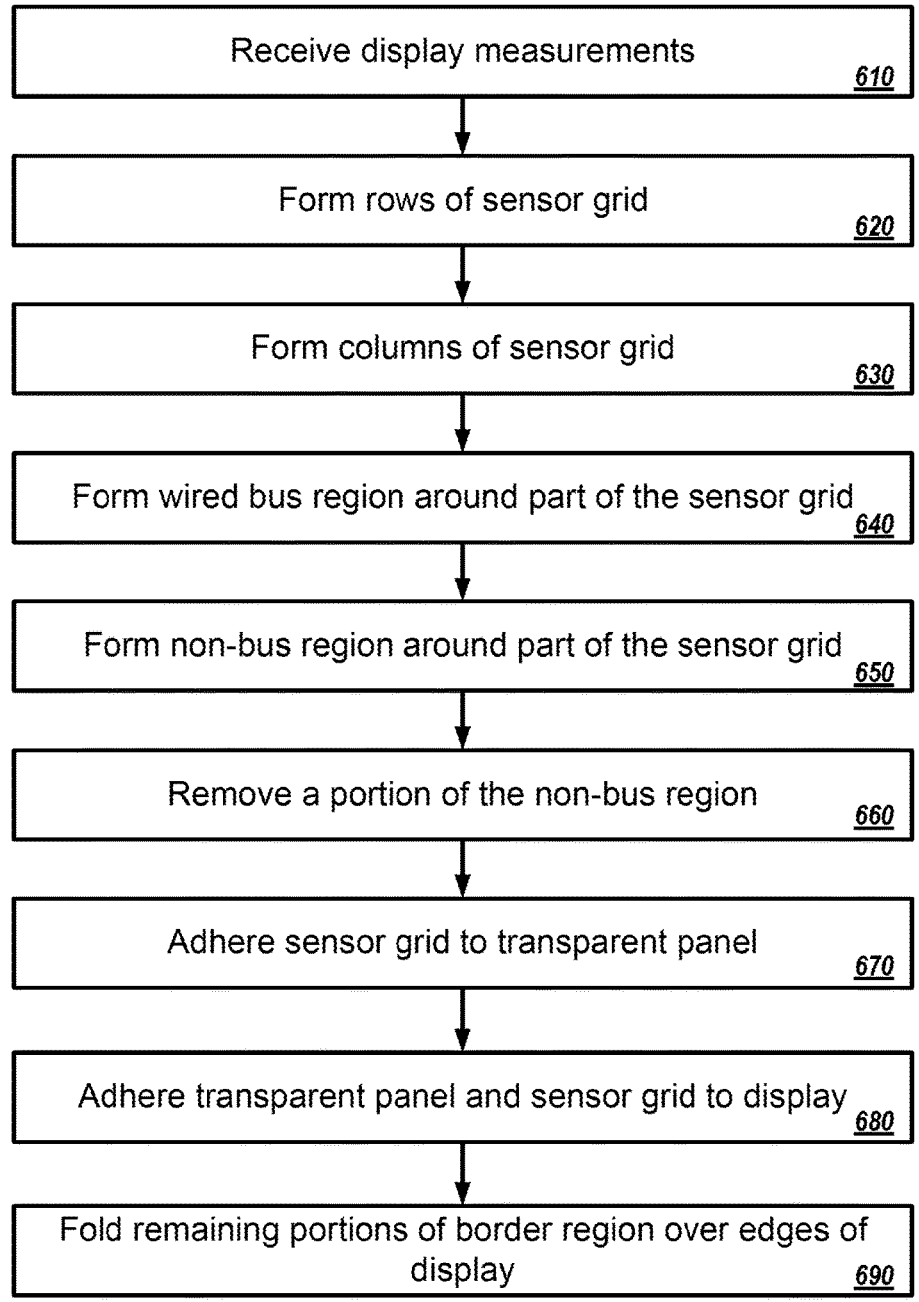
FIGS. 6 and 6A illustrate an example processes for adhering a projected capacitive touch sensor to a display screen.

FIG. 6 illustrates an example process 600 for adhering a projected capacitive touch sensor to a display screen. In general, the process 600 generates a projected capacitive touch sensor on a display screen to create a touch sensitive display. At least some of the process 600 may be performed by a computer system comprising one or more computers.

The system receives data indicating measurements of a display (610). In some implementations, the display is rectangular and does not include a border, or bezel, where images are not displayed. In some implementations, the display has curved edges. In some implementations, the display includes a bezel that is between $5/16$ inches and $5/8$ inches. In some implementations, the bezel may be removed and then may be reattached at the end of the process.

The system forms a sensor grid that matches the measurements of the display and that includes one or more electrically conductive rows in an at least partially transparent row layer (620). The system forms one or more electrically conductive columns in an at least partially transparent column layer that is spaced apart from the row layer (630). In some implementations, the rows are perpendicular to the columns.

The system forms a border region that surrounds at least a portion of the sensor grid and that includes a wired bus region that includes a row bus that extends from the one or more electrically conductive rows and a column bus that extends from the one or more electrically conductive columns (640). The system forms a non-bus region that does not include electrically conductive wires (650).

The system removes a portion of the non-bus region that is tangential to the sensor grid (660). The system adheres the sensor grid to a transparent panel that matches the measurement of the display (670). In some implementations, the transparent panel is glass.

The system adheres the transparent panel and the sensor grid to the display (680). In some implementations, an adhesive is placed on the bezel of the LCD screen to attach the transparent panel and the sensor grid. In some implementations, the adhesive is tape.

The system folds remaining portions of the border region over edges of the display (690). In some implementations, the remaining portions of the border regions are adhered to the sides of the bezel of the LCD screen using tape or another adhesive solution. The row connectors and column connectors are connected to a circuit that is configured to process the touch data.

The process 600 is repeated for multiple other LCDs. The LCDs with the attached sensor grids and folded edges are joined together to form a borderless video wall. Behind each LCD are row connectors and column connectors connected to the control circuitry. In some implementations, the row connectors and column connectors for all the touch panels are connected to one control circuit. In some implementations, an edge of the video wall includes a ribbon that is configured to block electromagnetic interference from the surrounding environment that may affect the video wall settings. Another edge of the video wall may include a support chute that is configured to support the video wall along a lower edge. The support chute is connected to multiple LCDs.

In some implementations, the video wall can be arranged on any direction. For example, the video wall may be T-shaped or circular shaped. The shape of the video wall may also be dictated by the LCD layout and dimensions. In some implementations, each sensor grid may operate independently. For example, a user may touch one LCD and another user touch another LCD and they will both respond. In some implementations, the video wall may act as one sensor and only respond to one touch at a time.

Figure 6A:
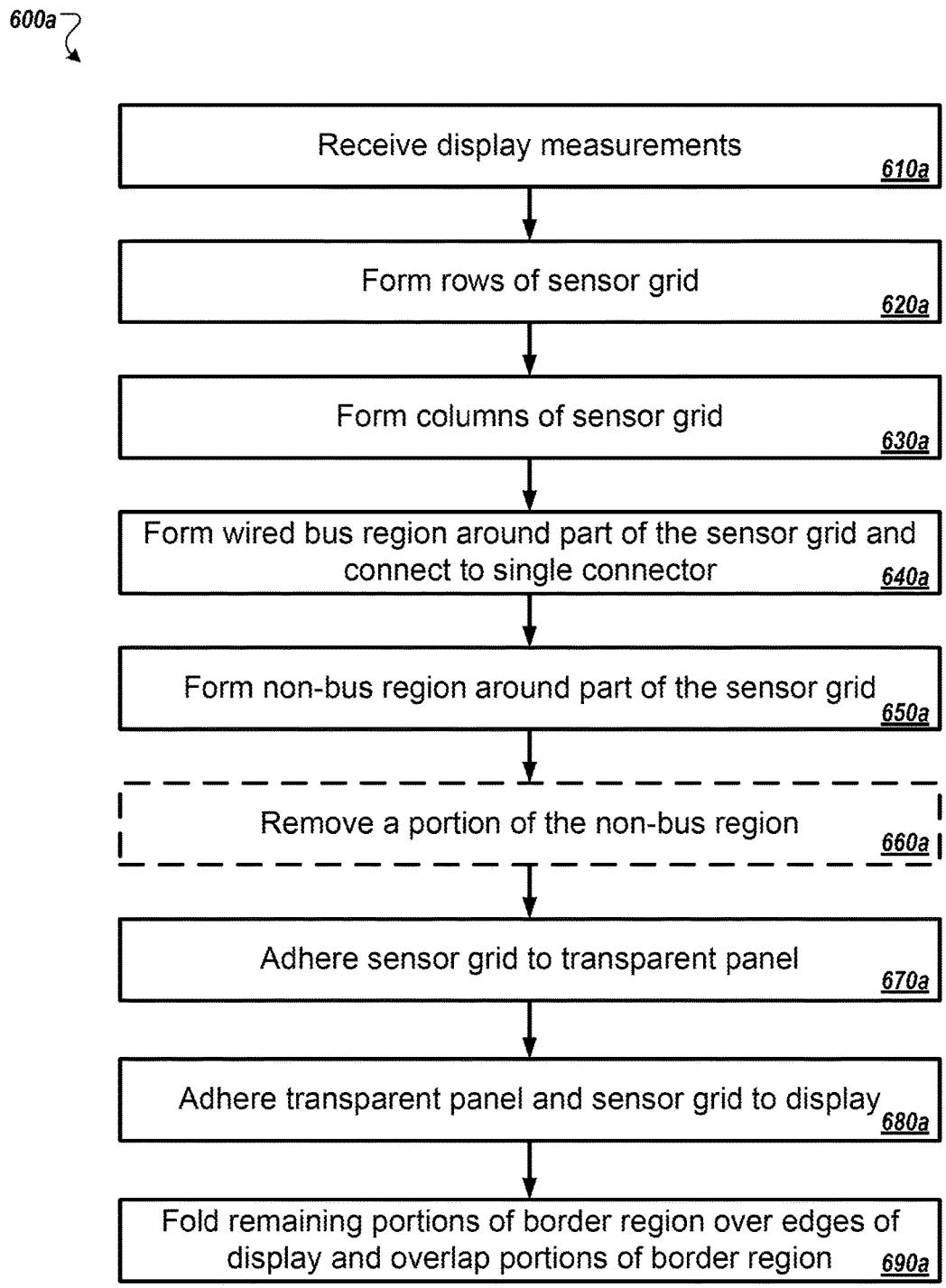

FIG. 6A illustrates an example process 600a for adhering a projected capacitive touch sensor to a display screen. In general, the process 600a generates a projected capacitive touch sensor on a display screen to create a touch sensitive display. At least some of the process 600a may be performed by a computer system comprising one or more computers.

The system receives data indicating measurements of a display (610). In some implementations, the display is rectangular and does not include a border, or bezel, where images are not displayed. In some implementations, the display includes a small bezel which may be removed for the process 600a and may be reattached at the end of process 600a. In some implementations, the display has curved edges. In some implementations, the display includes a bezel that is between $5/16$ inches and $5/8$ inches.

The system forms a sensor grid that matches the measurements of the display and that includes one or more electrically conductive rows in an at least partially transparent row layer (620a). The system forms one or more electrically conductive columns in an at least partially transparent column layer that is spaced apart from the row layer (630a). In some implementations, the rows are perpendicular to the columns.

The system forms a border region that surrounds at least a portion of the sensor grid and that includes a wired bus region that includes a row bus that extends from the one or more electrically conductive rows and a column bus that extends from the one or more electrically conductive columns (640a). Both the column bus and the row bus electrically connect to a single connector. The system forms a non-bus region that does not include electrically conductive wires (650a). In some implementations, the non-bus region may be continuous.

In some implementations, the system removes a portion of the non-bus region (660). The removed portion may include corners that are included in the non-bus region or other portions of the non-bus region. In some implementations, all of the non-bus region is removed. In some implementations, the corners of the non-bus region are removed. In some implementations, the non-bus region may be cut perpendicular to the edge of the projected capacitive touch sensor. For example, instead of cutting a corner, the system may cut diagonally from a corner of the projected capacitive touch sensor to a corner of the sensor grid. The system adheres the sensor grid to a transparent panel that matches the measurement of the display (670a). In some implementations, the transparent panel is glass.

The system adheres the transparent panel and the sensor grid to the display (680a). In some implementations, an adhesive is placed on the bezel of the LCD screen to attach the transparent panel and the sensor grid. In implementations where the bezel has been removed, the system places transparent panel and the sensor grid on the display. In some implementations, the adhesive is tape.

The system folds remaining portions of the border region over edges of the display (690a). In some implementations, the remaining portions of the border regions are adhered to the sides of the bezel of the LCD screen using tape or another adhesive solution. The connector is connected to a circuit that is configured to process the touch data. In locations where the border region is at a corner or does not fold flat against the edge of the display, the system folds the border region over itself. For example, at a corner location, the system folds the corner of the border region so that it overlaps itself and forms a triangle that is three layers thick. The portions of the border region that are likely to be folded and overlapped include corners that are part of the wired bus region. In some implementations, the overlapped portions are held in place with adhesive, for example, tape.

The process 600a is repeated for multiple other LCDs. The LCDs with the attached sensor grids and folded edges are joined together to form a borderless video wall. Behind each LCD is the connector connected to the control circuity. In some implementations, the connectors for all the touch panels are connected to one control circuit. In some implementations, an edge of the video wall includes a ribbon that is configured to block electromagnetic interference from the surrounding environment that may affect the video wall settings. Another edge of the video wall may include a support chute that is configured to support the video wall along a lower edge. The support chute is connected to multiple LCDs. In some implementations, touch panels with different numbers of connectors can be joined together. For example, a touch panel with a projected capacitive touch sensor with one connector may be joined to a projected capacitive touch sensor with two connectors.

In some implementations, the video wall can be arranged on any direction. For example, the video wall may be T-shaped or circular shaped. The shape of the video wall may also be dictated by the LCD layout and dimensions. In some implementations, each sensor grid may operate independently. For example, a user may touch one LCD and another user touch another LCD and they will both respond. In some implementations, the video wall may act as one sensor and only respond to one touch at a time.

In some implementations, any of the portions that are described above as being removed from the non-bus region of any of the projected capacitive touch sensors may not be formed in the initial stages of the process of forming the projected capacitive touch sensor. For example, the non-bus region in FIG. 4 may not be part of the originally formed border region 410. The border region 410 may only include the bus region with the row bus 430 and the column bus 425. In this example, none of the border region 410 is removed because there are no non-bus regions in the border region 410. Similarly in FIG. 4A, the border region 410a may only include the bus region with the row bus 430a and column bus 425a. None of the border region 410a is removed because there are no no-bus regions in the border region 410a.

In some implementations, one or more of the corners may be cut along a diagonal line and then each edge folded down with a remaining triangular region folded around the corner of the LCD. The diagonal line may extend from the corner at the edge of the projected capacitive touch sensor to the corner at the edge of the sensor grid. In instances where the projected capacitive touch sensor and sensor grid are not rectangular, the cut may be from an edge of the projected capacitive touch sensor to the edge of the sensor grid. When the border region is folded down the edge of the LCD some of the border region may overlap. In some implementations, the cut may be at a right angle to a line tangential to the edge of the projected capacitive touch sensor or the edge of the sensor grid or both.

Figure 7:
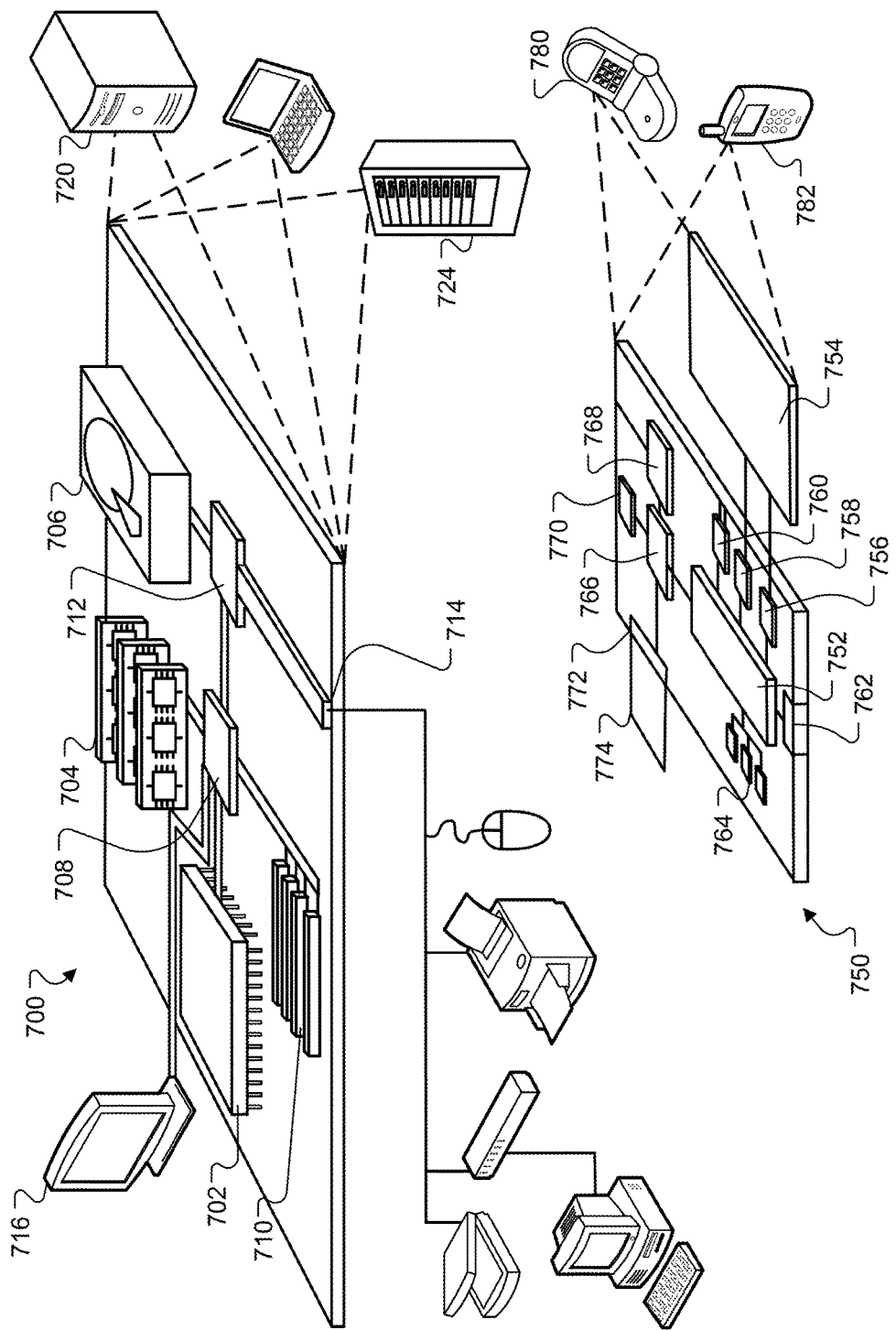
FIG. 7 illustrates an example of a computing device and a mobile computing device.

FIG. 7 shows an example of a computing device 700 and a mobile computing device 750 that can be used to implement the techniques described here. The computing device 700 is intended to represent various forms of digital computers, such as laptops, desktops, workstations, personal digital assistants, servers, blade servers, mainframes, and other appropriate computers. The mobile computing device 750 is intended to represent various forms of mobile devices, such as personal digital assistants, cellular telephones, smart-phones, and other similar computing devices. The components shown here, their connections and relationships, and their functions, are meant to be examples only, and are not meant to be limiting.

The computing device 700 includes a processor 702, a memory 704, a storage device 706, a high-speed interface 708 connecting to the memory 704 and multiple high-speed expansion ports 710, and a low-speed interface 712 connecting to a low-speed expansion port 714 and the storage device 706. Each of the processor 702, the memory 704, the storage device 706, the high-speed interface 708, the high-speed expansion ports 710, and the low-speed interface 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as a display 716 coupled to the high-speed interface 708. In other implementations, multiple processors and/or multiple buses may be used, as appropriate, along with multiple memories and types of memory. Also, multiple computing devices may be connected, with each device providing portions of the necessary operations (e.g., as a server bank, a group of blade servers, or a multi-processor system).

The memory 704 stores information within the computing device 700. In some implementations, the memory 704 is a volatile memory unit or units. In some implementations, the memory 704 is a non-volatile memory unit or units. The memory 704 may also be another form of computer-readable medium, such as a magnetic or optical disk.

The storage device 706 is capable of providing mass storage for the computing device 700. In some implementations, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. Instructions can be stored in an information carrier. The instructions, when executed by one or more processing devices (for example, processor 702), perform one or more methods, such as those described above. The instructions can also be stored by one or more storage devices such as computer- or machine-readable mediums (for example, the memory 704, the storage device 706, or memory on the processor 702).

The high-speed interface 708 manages bandwidth-intensive operations for the computing device 700, while the low-speed interface 712 manages lower bandwidth-intensive operations. Such allocation of functions is an example only. In some implementations, the high-speed interface 708 is coupled to the memory 704, the display 716 (e.g., through a graphics processor or accelerator), and to the high-speed expansion ports 710, which may accept various expansion cards. In the implementation, the low-speed interface 712 is coupled to the storage device 706 and the low-speed expansion port 714. The low-speed expansion port 714, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. In addition, it may be implemented in a personal computer such as a laptop computer 722. It may also be implemented as part of a rack server system 724. Alternatively, components from the computing device 700 may be combined with other components in a mobile device, such as a mobile computing device 750. Each of such devices may contain one or more of the computing device 700 and the mobile computing device 750, and an entire system may be made up of multiple computing devices communicating with each other.

The mobile computing device 750 includes a processor 752, a memory 764, an input/output device such as a display 754, a communication interface 766, and a transceiver 768, among other components. The mobile computing device 750 may also be provided with a storage device, such as a micro-drive or other device, to provide additional storage. Each of the processor 752, the memory 764, the display 754, the communication interface 766, and the transceiver 768, are interconnected using various buses, and several of the components may be mounted on a common motherboard or in other manners as appropriate.

The processor 752 can execute instructions within the mobile computing device 750, including instructions stored in the memory 764. The processor 752 may be implemented as a chipset of chips that include separate and multiple analog and digital processors. The processor 752 may provide, for example, for coordination of the other components of the mobile computing device 750, such as control of user interfaces, applications run by the mobile computing device 750, and wireless communication by the mobile computing device 750.

The processor 752 may communicate with a user through a control interface 758 and a display interface 756 coupled to the display 754. The display 754 may be, for example, a TFT (Thin-Film-Transistor Liquid Crystal Display) display or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may provide communication with the processor 752, so as to enable near area communication of the mobile computing device 750 with other devices. The external interface 762 may provide, for example, for wired communication in some implementations, or for wireless communication in other implementations, and multiple interfaces may also be used.

The memory 764 stores information within the mobile computing device 750. The memory 764 can be implemented as one or more of a computer-readable medium or media, a volatile memory unit or units, or a non-volatile memory unit or units. An expansion memory 774 may also be provided and connected to the mobile computing device 750 through an expansion interface 772, which may include, for example, a SIMM (Single In Line Memory Module) card interface. The expansion memory 774 may provide extra storage space for the mobile computing device 750, or may also store applications or other information for the mobile computing device 750. Specifically, the expansion memory 774 may include instructions to carry out or supplement the processes described above, and may include secure information also. Thus, for example, the expansion memory 774 may be provide as a security module for the mobile computing device 750, and may be programmed with instructions that permit secure use of the mobile computing device 750. In addition, secure applications may be provided via the SIMM cards, along with additional information, such as placing identifying information on the SIMM card in a non-hackable manner.

The memory may include, for example, flash memory and/or NVRAM memory (non-volatile random access memory), as discussed below. In some implementations, instructions are stored in an information carrier. The instructions, when executed by one or more processing devices (for example, processor 752), perform one or more methods, such as those described above. The instructions can also be stored by one or more storage devices, such as one or more computer- or machine-readable mediums (for example, the memory 764, the expansion memory 774, or memory on the processor 752). In some implementations, the instructions can be received in a propagated signal, for example, over the transceiver 768 or the external interface 762.

The mobile computing device 750 may communicate wirelessly through the communication interface 766, which may include digital signal processing circuitry where necessary. The communication interface 766 may provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), among others. Such communication may occur, for example, through the transceiver 768 using a radio-frequency. In addition, short-range communication may occur, such as using a Bluetooth, WiFi, or other such transceiver. In addition, a GPS (Global Positioning System) receiver module 770 may provide additional navigation- and location-related wireless data to the mobile computing device 750, which may be used as appropriate by applications running on the mobile computing device 750.

The mobile computing device 750 may also communicate audibly using an audio codec 760, which may receive spoken information from a user and convert it to usable digital information. The audio codec 760 may likewise generate audible sound for a user, such as through a speaker, e.g., in a handset of the mobile computing device 750. Such sound may include sound from voice telephone calls, may include recorded sound (e.g., voice messages, music files, etc.) and may also include sound generated by applications operating on the mobile computing device 750.

The mobile computing device 750 may be implemented in a number of different forms, as shown in the figure. For example, it may be implemented as a cellular telephone 780. It may also be implemented as part of a smart-phone 782, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. For example, while a client application is described as accessing the delegate(s), in other implementations the delegate(s) may be employed by other applications implemented by one or more processors, such as an application executing on one or more servers. In addition, the logic flows depicted in the figures do not require the particular order shown, or sequential order, to achieve desirable results. In addition, other actions may be provided, or actions may be eliminated, from the described flows, and other components may be added to, or removed from, the described systems. Accordingly, other implementations are within the scope of the following claims.

What is claimed is:

1. A projected capacitive touch sensor, comprising:
    a sensor grid that includes:
        one or more electrically conductive rows that are arranged in an at least partially transparent row layer; and
        one or more electrically conductive columns that are arranged in an at least partially transparent column layer that is spaced apart from the row layer;
    a border region that surrounds at least a portion of the sensor grid and that includes:
        a wired bus region that includes a row bus that extends from the one or more electrically conductive rows and a column bus that extends from the one or more electrically conductive columns; and
    one or more connectors that are electrically connected to the row bus and the column bus,
    wherein the wired bus region is configured to fold over an edge of a display screen that is configured to display an image up to the edge of the display screen.

2. The projected capacitive touch sensor of claim 1, wherein:
    the one or more connectors comprise:
        a row connector that is electrically connected to the row bus; and
        a column connector that is electrically connected to the column bus, and
    the border region further includes a non-bus region that does not include electrically conductive wires and that defines a removed portion of the non-bus region that is tangential to the sensor grid and that is located between the row bus and the column bus.

3. The projected capacitive touch sensor of claim 1, wherein:
    the one or more connectors comprise:
        a single connector that is electrically connected to the row bus and the column bus, and
    a portion of the row bus is located in a portion of the border region that is configured to fold over itself.

4. A projected capacitive touch sensor, comprising:
    a sensor grid that includes:
        one or more electrically conductive rows that are arranged in an at least partially transparent row layer; and
        one or more electrically conductive columns that are arranged in an at least partially transparent column layer that is spaced apart from the row layer; and
    a border region that surrounds at least a portion of the sensor grid, that is configured to fold over an edge of a display screen that is configured to display an image up to the edge of the display screen, and that includes:
        a wired bus region that includes a row bus that extends from the one or more electrically conductive rows and a column bus that extends from the one or more electrically conductive columns; and
        a non-bus region that does not include electrically conductive wires and that defines a removed portion of the non-bus region that is tangential to the sensor grid.

5. The projected capacitive touch sensor of claim 4, wherein the removed portion is located between the row bus and the column bus.

6. The projected capacitive touch sensor of claim 4, wherein the row bus extends into a row connector and the column bus extends into a column connector that is different than the row connector.

7. The projected capacitive touch sensor of claim 4, wherein no gap exists between the sensor region and the removed portion of the non-bus region.

8. The projected capacitive touch sensor of claim 4, wherein the removed portion is a corner section of the non-bus region.

9. The projected capacitive touch sensor of claim 4, wherein the sensor grid is rectangular and the removed portion is square.

10. The projected capacitive touch sensor of claim 4, wherein the removed portion comprises all of the border region.

11. A projected capacitive touch sensor, comprising:
    a sensor grid that includes:
        one or more electrically conductive rows that are arranged in an at least partially transparent row layer; and
        one or more electrically conductive columns that are arranged in an at least partially transparent column layer that is spaced apart from the row layer;
    a border region that surrounds at least a portion of the sensor grid and that includes:

a wired bus region (i) that includes a row bus that extends from the one or more electrically conductive rows and a column bus that extends from the one or more electrically conductive columns and (ii) that is configured to fold over an edge of a display screen that is configured to display an image up to the edge of the display screen; and a connector that is electrically connected to the row bus and the column bus, wherein a portion of the row bus is located in an area of the border region that is configured to fold over itself at a corner of the display screen.

12. The projected capacitive touch sensor of claim 11, wherein the area of the border region that is configured to fold over itself only includes the portion of the row bus and does not include the column bus.

13. The projected capacitive touch sensor of claim 11, wherein the sensor grid is rectangular and the area of the border region that is configured to fold over itself is square.

14. The projected capacitive touch sensor of claim 11, wherein the area of the border region that is configured to fold over itself is located at a corner of the projected capacitive touch sensor.

15. The projected capacitive touch sensor of claim 11, wherein the border region includes a non-bus region that does not include electrically conductive wires.

16. The projected capacitive touch sensor of claim 11, wherein the non-bus region defines removed portions that are located at corners of the projected capacitive touch sensor.

* * * * *